(12) United States Patent
Koganei

(10) Patent No.: US 6,987,652 B2
(45) Date of Patent: Jan. 17, 2006

(54) TAPERED ANGLE MAGNETORESISTIVE ELEMENT AND NONVOLATILE SOLID-STATE MEMORY USING THE SAME

(75) Inventor: Akio Koganei, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 32 days.

(21) Appl. No.: 10/260,065

(22) Filed: Oct. 1, 2002

(65) Prior Publication Data

US 2003/0067800 A1 Apr. 10, 2003

(30) Foreign Application Priority Data

Oct. 2, 2001 (JP) .............................. 2001-306540

(51) Int. Cl.
*G11B 5/39* (2006.01)
*G11C 11/15* (2006.01)
(52) U.S. Cl. ................ 360/324.2; 360/324.1; 360/313; 360/315; 365/173; 365/171; 365/158
(58) Field of Classification Search ................ 365/158, 365/173, 171; 360/313, 314, 315, 324, 324.1, 360/324.2
See application file for complete search history.

(56) References Cited

U.S. PATENT DOCUMENTS

| | | | | |
|---|---|---|---|---|
| 5,432,734 A | * | 7/1995 | Kawano et al. ............. | 365/158 |
| 5,620,784 A | * | 4/1997 | Tanuma et al. ............. | 428/212 |
| 5,748,524 A | | 5/1998 | Chen et al. .................. | 365/173 |
| 5,922,456 A | * | 7/1999 | Tanahashi et al. .......... | 428/332 |
| 6,055,179 A | | 4/2000 | Koganei et al. ............. | 365/158 |
| 6,111,784 A | * | 8/2000 | Nishimura .................. | 365/173 |
| 6,219,275 B1 | | 4/2001 | Nishimura .................. | 365/173 |
| 6,418,001 B1 | * | 7/2002 | Nakatani ................. | 360/324.2 |
| 6,483,676 B2 | * | 11/2002 | Nakatani ................. | 360/324.2 |

* cited by examiner

*Primary Examiner*—Andrew Q. Tran
(74) *Attorney, Agent, or Firm*—Fitzpatrick, Cella, Harper & Scinto

(57) ABSTRACT

The present invention provides a magnetoresistive element in which a first magnetic layer and a second magnetic layer whose coercive forces are different, and a non-magnetic layer that is disposed between the magnetic layers, wherein edges of the magnetoresistive element are tapered, or a magnetoresistive element in which a first magnetic layer and a second magnetic layer, and a non-magnetic layer that is disposed between the magnetic layers, wherein the coercive force of the first magnetic layer is larger than the coercive force of the second magnetic layer, and wherein relation between a base area S1 of the first magnetic layer and a base area S2 of the second magnetic layer is S1>S2.

9 Claims, 11 Drawing Sheets

TAPERED ANGLE MAGNETORESISTIVE ELEMENT AND NONVOLATILE SOLID-STATE MEMORY USING THE SAME

BACKGROUND OF THE INVENTION

1. Field of the Invention

The present invention relates to a nonvolatile solid-state memory element that uses magnetoresistive elements, and memory and a method of recording and reproducing thereof.

2. Related Background Art

Recently, mobile terminals including on mobile phones and PDA have been developed actively. In mobile devices, the necessity of high-capacity nonvolatile high-speed access memory as memory for storage is clamored. Several years ago, Giant magnetoresistance was discovered in a magnetoresistive film formed by sandwiching a non-magnetic layer between ferromagnetic layers. In recent years, a magnetic sensor, a magnetic memory element, and Magnetic Random Access Memory (MRAM) that use this phenomenon have attracted attention. A change of electric resistance at the time when a current is flowed in the direction vertical to a thin film stacked in a ferromagnetic layer/a non-magnetic insulating layer/a ferromagnetic layer is detected as a change of a tunneling current caused by the difference between spin polarization rates of the ferromagnetic layer with making the non-magnetic insulating layer a tunnel barrier layer. This is called a Tunneling Magnetoresistance (TMR) effect. Since a TMR element can obtain high magnetoresistance, development for the practical use of MRAM and magnetic heads has been accelerated.

In MRAM, the two ferromagnetic layers and the non-magnetic thin layer therebetween become the basic structure for storing information. A state of "0" or "1" is stored by using a phenomenon where resistance differs in the case of the magnetization direction of the ferromagnetic layer sandwiching the non-magnetic layer being oriented, and in the case of being antiparallel.

In regard to information reading, an absolute detection system of judging a state from an absolute value of resistance and a differential detection method of reading the state of "0" or "1" by applying a magnetic field weaker than that at the time of writing and reversing the magnetization of only the ferromagnetic layer with lower coercive force are known.

In the absolute detection method, information writing is performed by changing the magnetization direction of one of two ferromagnetic layers, whose coercive force is weaker than that of the other, by an external magnetic field. In the differential detection method, the information writing is performed by changing the magnetization direction of one of two ferromagnetic layers, whose coercive force is higher than that of the other, by the external magnetic field. A method of using a magnetic field generated by flowing a current in wiring that is arranged in the vicinity of a magnetoresistive element is known.

Since storing information magnetically, MRAM has advantages such as excellence in radiation resistance, theoretical nonvolatility, high speed, and no limitation in writing frequency. Since the high recording density can be easily attained by using existing semiconductor technology, it is expectable that MRAM takes the place of DRAM in future.

Magnetic material used for MRAM can be classified according to the magnetization direction into an inplane magnetization film type having a magnetization component parallel to a film surface, and a vertical magnetization film having a magnetization component perpendicular to a film surface. Ferromagnetic substances such as NiFe and Co are inplane magnetization film types whose magnetization directions are parallel to each film surface. However, in the inplane magnetization film, there is a problem that a curling phenomenon of magnetization arises since an anti-magnetic field increases because magnetic poles approaches with each other when the miniaturization of magnetic substances is promoted. If the curling arises, it becomes difficult to determine the magnetization direction. Therefore, in MRAM that uses the inplane magnetization film, so as to give shape anisotropy, it is necessary to make the ferromagnetic layer a shape (rectangle etc.) with a major axis in flatly viewing a ferromagnetic layer that becomes a memory cell. It is expected that a ratio of a major axis of a rectangle to a minor axis is required to be at least two or more. Hence, since the size of a memory cell is restricted for the prevention of the curling phenomenon, which becomes an obstruction factor of integration improvement.

On the other hand, when ferrimagnetic material made of rare-earth transition metal such as TbFe, TbFeCo, and GdFe is used as a ferromagnetic layer, it is possible to make the ferromagnetic layer a perpendicular magnetic film by controlling film thickness and composition. In the perpendicular magnetic film, since the magnetization direction orients in the direction vertical to a film surface where an anti-magnetic field is the largest in a shape, this means that the magnetization has already defeat a maximum anti-magnetic field coefficient when the perpendicular magnetic anisotropy is shown. That is, it is not necessary to make a memory cell rectangular like the inplane magnetization film, and hence, it is possible to equalize the width and length of the memory cell. Moreover, since a flat area becomes small in comparison with the of film thickness direction that is an easy magnetization axis direction when the element is miniaturized, this becomes a direction, where the curling of magnetization does not occur easily, in the viewpoint of the shape anisotropy. Therefore, the perpendicular magnetic film type is more advantageous than the inplane magnetization film type in the improvement of integration of a memory cell portion. U.S. Pat. No. 6,219,275 describes a magnetoresistive film, which uses the perpendicular magnetic film, in detail.

Since a magnetic memory cell that uses such a magnetoresistive element as a memory cell is stacked with two magnetic layers sandwiching a thin non-magnetic layer, a stray field generated from one magnetic layer in the magnetic memory cell is applied to the other magnetic layer. Hence, even when there is no external magnetic field, the memory cell becomes in a state that a magnetic field is applied.

FIGS. 23A and 23B show sectional views explaining magnetization directions about a magnetoresistive element that a magnetic film is made of a perpendicular magnetic film. A magnetic layer 200 with low coercive force and a magnetic layer 100 with high coercive force are constituted in a shape of sandwiching a non-magnetic layer 300. The magnetic layer 100 is magnetized downward in both FIGS. 23A and 23B, and the magnetic layer 200 is magnetized downward in FIG. 23A, and is magnetized upward in FIG. 23B, and resistance in FIG. 23B is larger than that in FIG. 23A.

It can be considered that these show the structure of using the absolute value detection method, that is, the magnetic layer 100 is a pinning layer where the magnetization direction is constant, the magnetic layer 200 is a memory layer, FIG. 23A shows a state of recording 0, and FIG. 23B shows a state of recording 1. Alternatively, it can be also considered that these show the structure of using the differential detection method, that is, the magnetic layer 100 is a memory layer, the magnetic layer 200 is a detection layer, and the external magnetic field reverses the magnetization direction of the detection layer from a state in FIG. 23A to a state in FIG. 23B at the time of detection.

FIG. 24A shows the relation between the resistance of this element and the applied magnetic field. This is shown supposing a squareness is 1 and there is no stray field from the magnetic film. Since the magnetization direction does not change because an external magnetic field that is smaller than the coercive force of the magnetic layer 100 is applied, resistance changes corresponding to the magnetization direction of the magnetic layer 200 are shown. If there is no offset magnetic field, it is possible to perform recording in the memory layer or to perform the magnetization reversal of the detection layer only by applying a reversed magnetic field H1 that is the same magnitude as coercive force Hc, or H2.

However, actually, since a downward magnetic field is applied to the magnetic layer 200 from the magnetic layer 100, an MR curve shifts by an offset magnetic field HO as shown in FIG. 24B. In this case, since the reversed magnetic fields become H2=Hc+HO and H1=Hc−HO, a magnetic field necessary for changing the state in FIG. 24B to the state in FIG. 24A becomes small by HO. On the contrary, when changing the state in FIG. 24A to the state in FIG. 24B, the necessary magnetic field becomes large by HO. Since this means that a value of a current flowing into a write line becomes large in MRAM that uses such a magnetoresistive film in a memory element, there arises a problem that a consumption current increases, or that writing becomes impossible if the current value exceeds an allowable current density of write wiring. Moreover, the reversed magnetic field varies according to recorded information, that is, the magnetization direction of the magnetic film. Hence, when recording information by selecting a memory cell from among memory cells, arranged in a matrix, with two orthogonal write lines, this increases a possibility that such a recording mistake that, for example, when rewriting information in a memory cell that requires the reversed magnetic field H2, information in a memory cell that adjoins the memory cell and requires the reversed magnetic field H1 is also rewritten arises. Moreover, as show in FIG. 24C, when the offset magnetic field HO becomes larger than the coercive force Hc, resistance to be given becomes only one when the magnetic field is 0. Hence, there is a possibility that the absolute detection cannot be performed.

Furthermore, in the case that the squareness is not 1, as shown in FIG. 25, resistance R2 in a state without a magnetic field becomes smaller than a maximum resistance Rmax in an unparallel magnetized state. In this case, since difference R2−R1 between read resistance values becomes small, detection sensitivity deteriorates.

Though the above description is performed assuming the absolute value detection method, a case of using the differential detection method is also the same as this.

Moreover, the above-described problems are especially remarkable in the inplane magnetization film conventionally used in MRAM. This is because the saturation magnetization of material such as NiFe and Co that is used in MRAM using the inplane magnetization film is large, and it is necessary to give the shape anisotropy by making the inplane magnetization film slim so as to avoid an influence of the above-described curling.

Since the magnitude of the magnetization of ferrimagnetic material such as TbFeCo and GdFeCo that is used in MRAM using the perpendicular magnetic film can be reduced by composition modulation, it is possible to essentially design the small offset magnetic field. Nevertheless, in order to satisfy requirements such as preservability of recording magnetization, thermal resistance, and corrosion resistance, it is actually difficult to remove the offset completely.

A first issue of the present invention is to solve the problem that due to a static magnetic field from such a magnetic layer a reversed magnetic field of another magnetic layer offsets.

A second issue is to solve the problem that the record magnetic field increases by the offset of the reversed magnetic field, and the problem that a recording failure arises.

A third issue is to reduce cost increase, caused by achieving the first issue, as much as possible.

A fourth issue is to improve the stability of recording and reproducing operation of a memory device, and to achieve nonvolatile solid-state memory that can record and reproduce information at high speed.

The present invention is to solve at least one of the above-described issues.

SUMMARY OF THE INVENTION

In consideration of the above-described issues, the present invention relates to a magnetoresistive element in which a first magnetic layer and a second magnetic layer whose coercive forces are different, and a non-magnetic layer that is sandwiched by the magnetic layers are arranged, and provide a magnetoresistive element in which edges of the above-described magnetoresistive element is tapered.

In addition, the present invention relates to a magnetoresistive element in which a first magnetic layer and a second magnetic, and a non-magnetic layer that is sandwiched by the above-described magnetic layers are arranged, and provide a magnetoresistive element in which the coercive force of the first magnetic layer is larger than the coercive force of the second magnetic layer, and the relation between a base area S1 of the above-described first magnetic layer and a base area S2 of the above-described second magnetic layer is S1>S2.

Moreover, the present invention provide nonvolatile solid-state memory in which the above-described magnetoresistive elements are formed in a matrix as memory elements on a substrate, and which is characterized by comprising a bit line connected to the above-described magnetoresistive elements, a write line to change a magnetization direction of the above-described first magnetic layer or second magnetic layer by a magnetic field generated by a current, and switching elements connected to the above-described memory elements.

DESCRIPTION OF THE PREFERRED EMBODIMENTS

The present invention is devised by paying attention to a fact that a stray field from a perpendicular magnetic film is large in an edge of the film and comparatively small in a central portion, and finding that, even if stacking is performed while avoiding the edge of the film, it is possible to reduce the influence of the stray field from one magnetic layer, and in consequence, it is possible to reduce an offset of a reversed magnetic field of the magnetoresistive element.

Embodiments of the present invention will be explained by using drawings.

Figure 1:
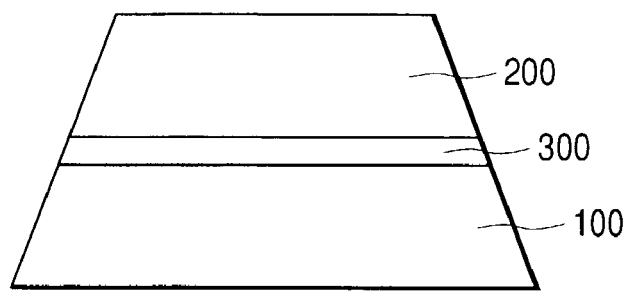
FIG. 1 is a diagram showing an example of cross-sectional structure of a magnetoresistive element according to the present invention.

FIG. 1 shows the cross-sectional structure of a magnetoresistive element according to the present invention. A second magnetic layer 200 with low coercive force, and a first magnetic layer 100 with high coercive force sandwich a tunnel insulating film 300, and the first magnetic layer 100 is a side near a substrate.

A cross-sectional shape of the magnetoresistive element according to the present invention is a trapezoid. That is, the magnetoresistive element is tapered in its edges. Here, the trapezoid is not a so-called trapezoid in a strict meaning, but it is sufficient so long as the shape has tapers in its edges. Hence, the first magnetic layer 100 with large coercive force is larger than the second small magnetic layer 200 with small coercive force. That is, the area of base, S1 of the first magnetic layer with large coercive force is larger than the area of base, S2 of the second magnetic layer with relatively small coercive force. Owing to such structure, the influence of a stray field that the second magnetic layer 200 is given from the first magnetic layer 100 is negligible. Therefore, it becomes possible to make an offset not arise in a reversed magnetic field of the second magnetic layer 200, or to reduce the offset.

Figure 2:
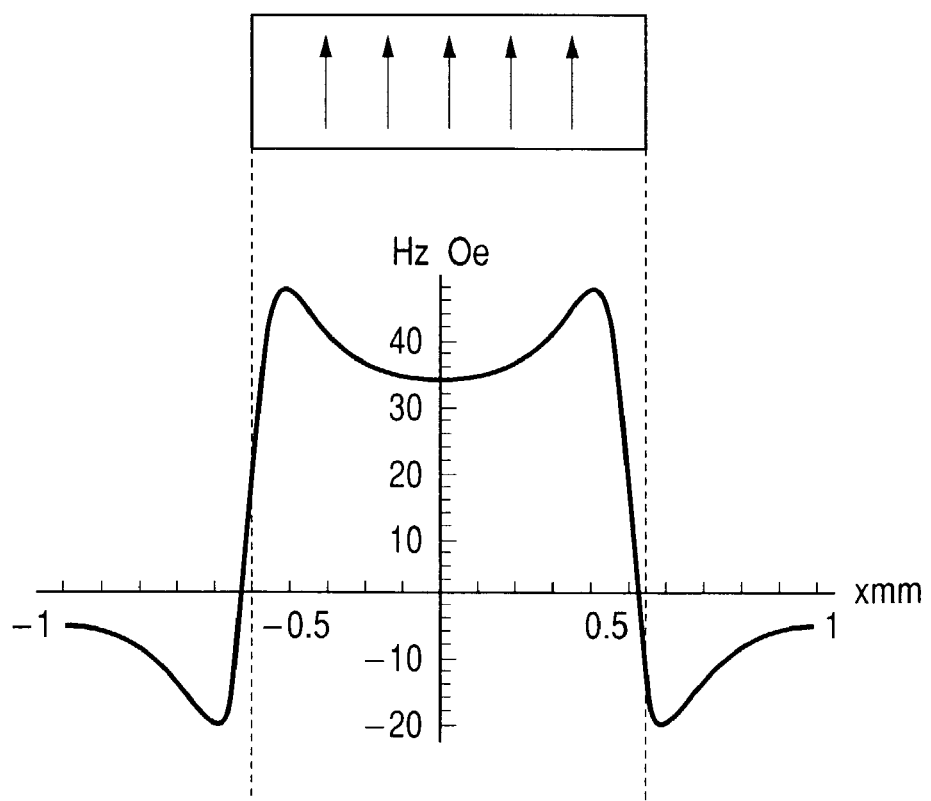
FIG. 2 is a graph for explaining a stray field from a perpendicular magnetic film at a location 75 nm apart from a film surface.

FIG. 2 is a schematic diagram showing the strength of a stray field from a perpendicular magnetic film. This was calculated as a fundamental examination of the present invention. Specifications of the perpendicular magnetic film were Ms=100 emu/cc, length=1 $\mu$m, width=1 $\mu$m, and thickness= 30 nm, and values in a location 75 nm apart from a film surface were calculated. The horizontal axis denotes the distance X in the inplane direction, and the vertical axis denotes the vertical (Z) component of a leakage perpendicular field. As apparent from FIG. 2, though being large edges (X=±0.5 $\mu$m) of the film, the strength of the perpendicular field was about 65% of that in the edges, that is, extremely small in a central portion (X=0 $\mu$m). The nearer the distance from the film surface became, the more remarkable this difference became, and hence, the strength at the central portion in a location apart 2 nm from the film surface decreased to about 19% of that in the edges (refer to FIG. 3).

Figure 3:
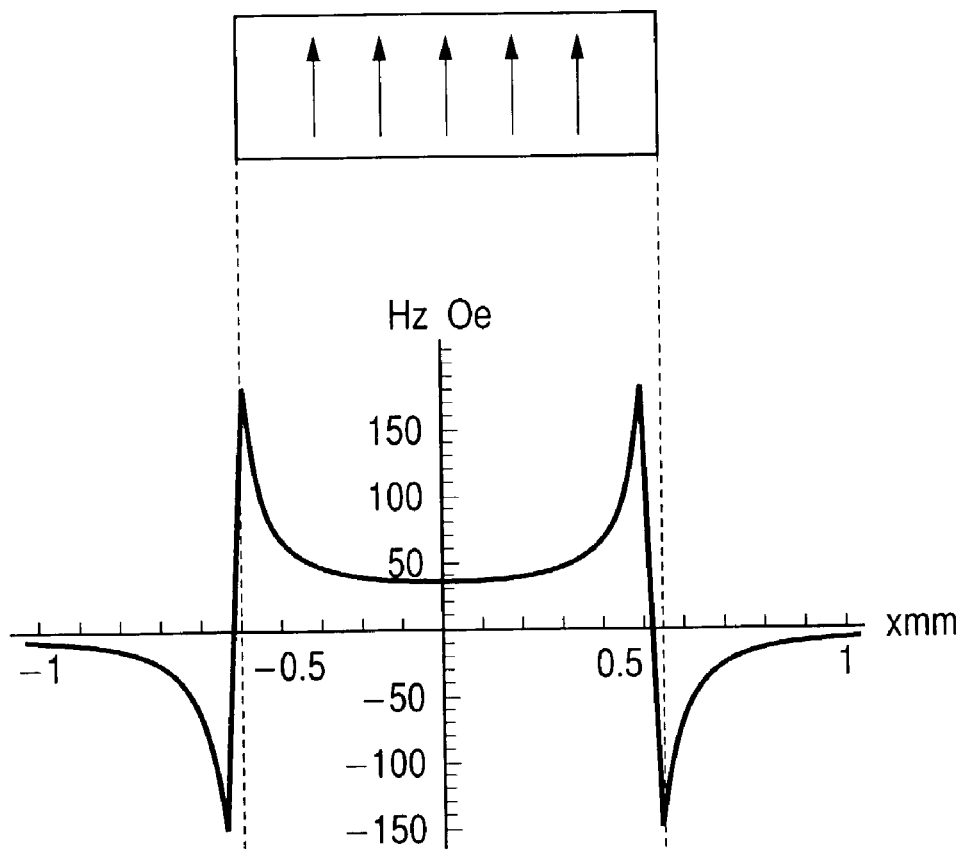
FIG. 3 is a graph for explaining a stray field from a perpendicular magnetic film at a location 2 nm apart from a film surface.

When the thickness of the non-magnetic layer of the magnetoresistive element is thin, the thickness is by an order of several nm, and hence, the layer becomes a shape near the case in FIG. 3. That is, the nearer the distance from the magnetic film that generates a stray field becomes, the larger its influence increases, and hence, the structure of the present invention becomes very effective. In general, in regard to a GMR element and a TMR element, the film thickness of the non-magnetic layer of the TMR element is apt to be thinner than that of the GMR element, and hence, in particular, the structure of the present invention is effective.

Hence, when using such structure as shown in FIG. 1, the second magnetic layer 200 is made to avoid a portion in which the stray field from the first magnetic layer 100 is strong. Hence, it becomes possible to extremely lessen the offset of the reversed magnetic field of the second magnetic layer 200 that is caused by the stray field from the first magnetic layer 100.

Figure 4:
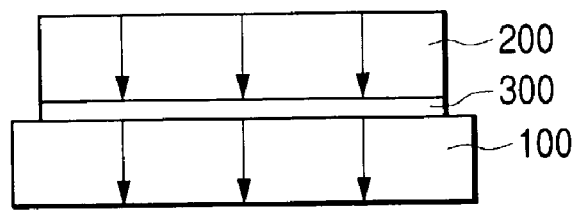
FIG. 4 is a schematic sectional diagram showing an example of a magnetoresistive element according to the present invention.

Since the above-described effect depends on the size difference between magnetic layers essentially, for example, as shown in FIG. 4, it may be good to enlarge the magnetic layer 100 by patterning each magnetic layer independently. Nevertheless, it is not good idea in consideration of the thin non-magnetic layer 300 and complicated process. As shown in FIG. 1, it becomes possible to perform processing in one process by using the structure where edges of the element have tapered geometry. Hence, it becomes possible to perform processing with good repeatability without the process becoming complicated.

In the viewpoint of avoiding a stray field from the first magnetic layer 100 as much as possible, it is desirable that the size difference between the second magnetic layer 200 and first magnetic layer 100 is large, and in other words, it is desirable that tapered angles are low gradients. Nevertheless, since an effective area of the memory cell increases when a wall angle is too small, this is undesirable in the viewpoint of raising memory integration. Moreover, since it is difficult to achieve an extreme low gradient also in the production process, a range from 30° to 90° is preferable, and though being described later, an angle from 30° to 70° is more preferable since the influence of the stray field decreases.

Figure 5:
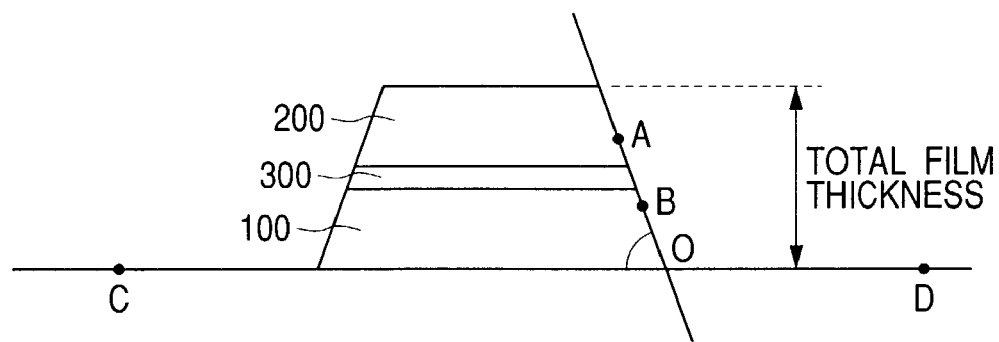
FIG. 5 is a schematic diagram for defining a sidewall angle.

Here, as an example of the definition of the wall angle, it is possible to conveniently define the wall angle as an angle AOC formed by a point A at the height of 70% of the entire film thickness of the magnetoresistive element, an intersection O of a straight line AB which connects the point A to a point B at the height of 40% of the entire film thickness and a substrate surface CD, and a point C on the substrate surface CD, the intersection O being a vertex. (FIG. 5) Moreover, since there were local distributions, the averaging of measurements at five locations was adopted, and it was assumed that an error was ±5°.

In addition, as described above, a cross-sectional shape of an actual magnetoresistive element does not become a geometrical trapezoid, but straight lines exist together with curves. Moreover, locally irregular forms are included.

Figure 6A:
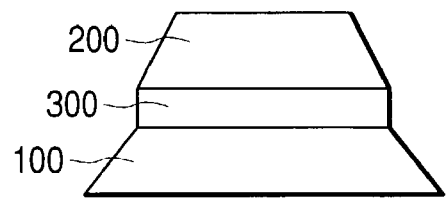
FIGS. 6A and 6B are schematic diagrams for explaining the influence of an etching rate against the cross-sectional geometry of a magnetoresistive element.
Figure 6B:
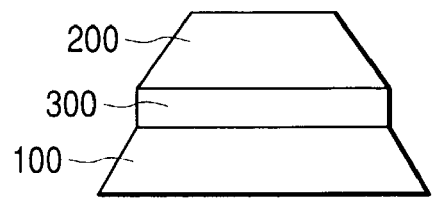

For example, when etching rates of the first magnetic layer and second magnetic layer are different when the magnetoresistive element is made a trapezoid by etching, as show in FIGS. 6A and 6B, it is possible to obtain a shape where inclinations of sidewalls are different. Also in such a shape, an area of base of the second magnetic layer becomes small in comparison with an area of base of the first magnetic layer, and hence, it is possible to avoid a large region of the stray field.

Moreover, though FIG. 1 shows only the magnetoresistive element, it is needless to say that the magnetoresistive element is enclosed with insulating material in the embodiment of MRAM, that an electrode film necessary for taking out a signal is formed, and that a substrate to hold them is provided.

The process for producing the structure of making a sectional shape a trapezoid can be realized by various fine-processing technologies conventionally known.

When making the sectional shape a trapezoid by etching, isotropic production process such as wet etching can be easily used. Even when anisotropic etching using nonequilibrium plasma is used, so long as an inclination angle is provided in the resist mask produced beforehand, film geometry is formed by tracing the resist shape, it is possible to make the shape trapezoidal. Producing conditions of resist masks and the adjustment of etching parameters are executable for those skilled in the art. Moreover, in FIG. 1, supposing the first magnetic layer is a substrate side, it is easier to form tapers by usual processing as shown in FIG. 1. Hence it is preferable to form the layer, formed on the substrate side, as a layer with relatively large coercive force.

Moreover, in the case of production process using an ion beam such as FIB (focused ion beam) and ion milling, it is possible to make the shape trapezoidal by inclining a beam direction at a desirable angle by inclining the substrate.

Figure 7:
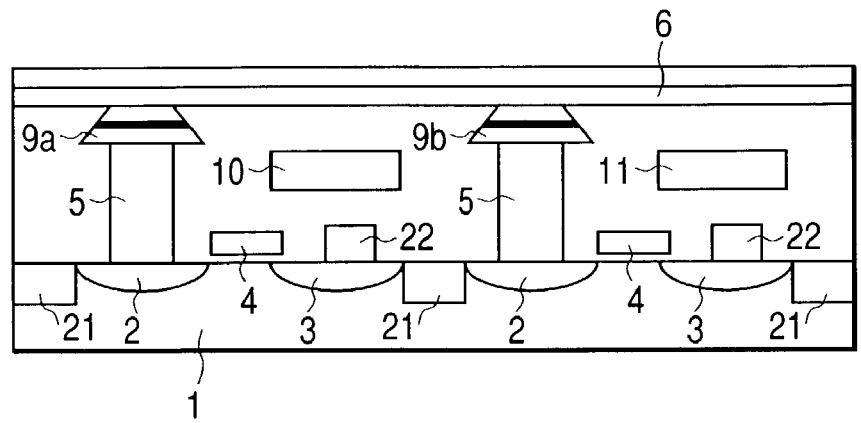
FIG. 7 is a sectional view showing a memory device that uses magnetoresistive elements according to the present invention.

Next, FIG. 7 shows the sectional structure of a memory device that uses magnetoresistive elements. In addition, a portion to which a symbol is not assigned fundamentally denotes an insulator. Two bits of memory elements are shown in FIG. 7, and portions whose functions are the same, and which are peculiar to each are separately shown as a and b. On a semiconductor substrate 1, a drain region 2 and a source region 3 are formed, and further, a gate electrode 4 is formed through an insulating film, these constituting a MOSFET (field effect transistor). Each field effect transistor is insulated with a LOCOS field oxide film 21.

A magnetoresistive element 9 that has a magnetic film, which is magnetized in the direction vertical to a film surface, through a plug electrode 5 at a position just above the drain region 2 is connected to the drain region 2 of the field effect transistor, and further, a bit line 6 is connected. A grounding wire not shown is provided in a source electrode 22. Moreover, write lines 10 and 11 are provided through the insulator under a side of magnetoresistive element 9a(9b). The write lines 10 and 11, gate line 4, and grounding wire connected to the source electrode extend in the direction vertical to this paper face. The bit line 6 extends in the direction parallel to this paper face. Here, the write line is a line provided so as to apply a magnetic field determining a magnetization direction denoting information.

As the substrate, a non-magnetic material substrate with high flatness such as Si wafer, quartz, or SOI is used. As a production method of the SOI substrate, various methods such as an ELTRAN method and an SIMOX method are applicable. At that time, it is preferable that the Si crystal orientation of the substrate surface is (100).

When the magnetoresistive film is formed on the above-described substrate, a buffer layer is inserted so as to achieve boundary structure that is further highly flat by adjusting surface free energy under the first magnetic film. As the buffer layer, various metals such as Ta, Cu, and Cr, and insulators such as SiN, $SiO_2$, and $Al_2O_3$ are used, but, depending on the substrate material and the material of the magnetoresistive film, it is not necessary to insert the buffer layer. A suitable range of film thickness of the buffer layer is 2 to 10 nm. This is because there is a problem of the ununiformity of film quality by island growth in the case of the thickness less than 2 nm depending on a film-forming method, and on the other hand, there is another problem of productivity decrease in the case of the thickness more than 10 nm.

For a spin scattering film, as the non-magnetic layer, a conductor is used. Though Cu, Ag, Au, Al, and Mg, etc. are used, it is more preferable to use Cu. A suitable range of film thickness of the non-magnetic layer is 1 to 10 nm. This is because there is a possibility of generating a pin hole because of island growth and another possibility of magnetoresistance not appearing due to an interaction of both magnetisms in the thickness less than 1 nm depending on the film-forming method, and on the other hand, magnetoresistance becomes small since spin dependent scattering decreases because of too wide gap between both magnetic layers to a mean free path of electrons in the case of the thickness exceeding 10 nm.

For a spin tunneling film, as the non-magnetic layer, an insulator is used. As the insulator, though the oxide and nitride of Al, Si, Cu, Mg, etc. are usable, Al oxide whose Fermi level is near other magnetic layers is used more suitably. A suitable range of film thickness of the non-magnetic layer is 0.5 to 5 nm. This is because there is a possibility of generating a pin hole because of island growth and another possibility of magnetoresistance not appearing due to an interaction of both magnetisms in the thickness less than 0.5 nm depending on the film-forming method, and on the other hand, magnetoresistance becomes small since a tunneling probability decreases because of too wide gap between both magnetic layers to a mean free path of electrons in the case of the thickness exceeding 5 nm.

The combination of the first magnetic layer and second magnetic layer that are components of the magnetoresistive film consists of soft magnetic material and hard magnetic material. Hence, when it is made that the first magnetic layer is a hard magnetic layer and the second magnetic layer is a soft magnetic layer, it is possible to easily give different coercive forces to the layers. In the differential detection method, since the magnetization of the soft magnetic material is easily reversed, the soft magnetic material functions as a reproduction layer. Since the magnetization of the hard magnetic material is not easily reversed in comparison with the soft magnetic material, the hard magnetic material functions as a memory layer. In addition, in the present invention, the distinction between the soft magnetic material and hard magnetic material is defined by magnitude correlation between coercive forces of two magnetic layers, and the material with coercive force relatively large is made the hard magnetic material.

Moreover, the first magnetic layer and second magnetic layer denote functions, and each magnetic layer can be a single-layer consisting of a single element, or can be multilayered structure made of various alloys. For example, so as to function as the hard magnetic material, as the first (or, the second) magnetic layer, it is possible to use material formed by pinning as a double-layer structure of 5-nm thick Co and 30-nm thick FeMn, or ferrimagnetic material formed by combining Tb, Gd, and Dy as rare-earth metal and Fe, Co, etc. as transition metal when using the material as a perpendicular magnetic film. The composition of these two magnetic layers is properly adjusted so that coercive forces may be different. A suitable range of film thickness of the first magnetic layer and second magnetic layer is 2 to 100 nm.

As described above, the resistance of the magnetoresistive film in the stacked direction is determined according to a relative angle of the magnetization of the first magnetic layer and second magnetic layer. Resistance becomes low when both are parallel to each other, and resistance becomes high when both are in an anti-parallel situation. When difference between state densities of an up spin and a down spin is large, the magnetoresistance is large, and a regenerative signal becomes large. Hence, it is more preferable to insert magnetic material with a high spin polarization rate in the vicinity of a boundary of the insulating layer between the first magnetic layer and second magnetic layer, since a magnetoresistance ratio improves. Specifically, it is possible to theoretically obtain a resistivity change near to 50% by inserting magnetic material, whose main component is Fe, Co, or the like, in the vicinity of the boundary.

Though the large part of these magnetic materials including Fe and Co becomes the inplane magnetization film, each of them functions as a perpendicular magnetic film by exchange-coupling with the first magnetic layer and second magnetic layer that is constituted by the perpendicular magnetic films by thinning the magnetic material up to several nm or less. Hence, magnetization directions are united in the direction vertical to the film surface, and hence, a signal never becomes small.

Figure 8:
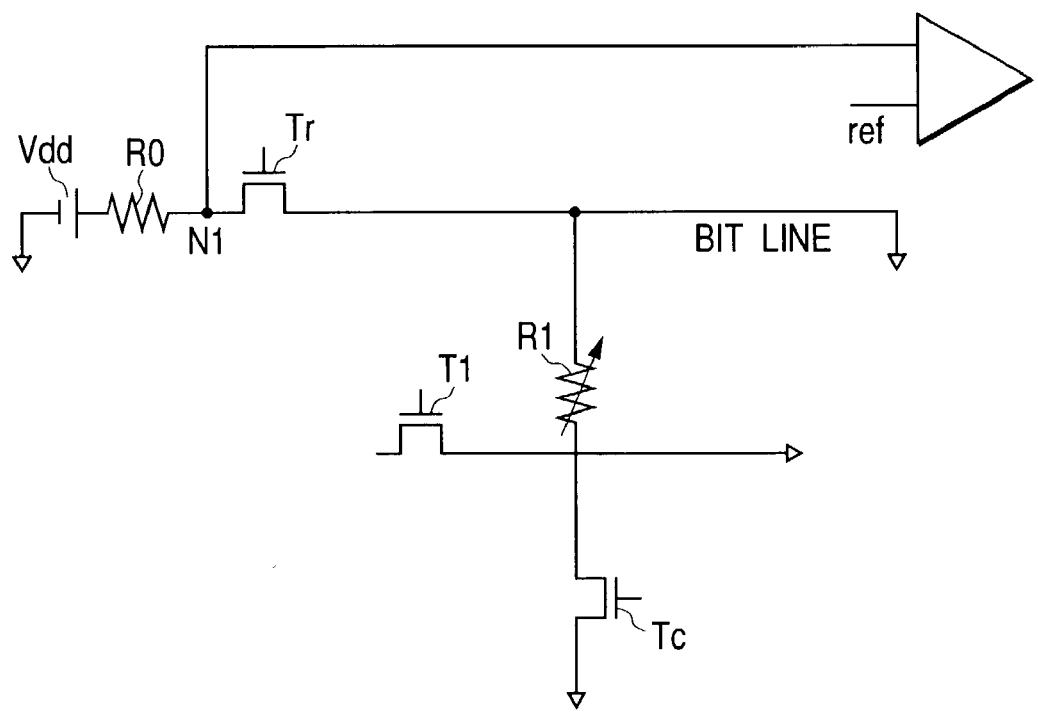
FIG. 8 is an equivalent circuit diagram showing an embodiment of memory according to the present invention.

Next, a recording and reproducing method will be explained by using FIG. 8. Though FIG. 8 shows a circuit diagram that corresponds to one memory element, actually, a lot of memory elements are arranged on the substrate in a matrix.

A field effect transistor Tc is connected to one terminal of the magnetoresistive film R1, and another terminal is connected to a bit line. One terminal of the bit line is connected to a ground line having an earth potential, and another terminal is connected to a power supply line, having a voltage Vdd, through a load RO and a selection transistor Tr.

A node N1 between the selection transistor and load RO is connected to a sense amplifier S.A., and another terminal of the sense amplifier is connected to a reference resistor (not shown) that becomes a reference. Moreover, a write line is connected in the vicinity of the magnetoresistive film R1 through a transistor T1.

Reproducing operation will be explained in the beginning. When a field effect transistor Tc is selected and the selection transistor Tr on the bit line is turned on, the power supply voltage Vdd is applied to the magnetoresistive film R1 through the load RO. At this time, it is judged by comparing the potential of the node N1 with a voltage of the reference resistor which of a high-resistive state or a state of the low-resistance the resistance of the magnetoresistive film R1 is. A value of the reference resistor is set to become a mean value between two of high and low resistances of the magnetoresistive film R1.

Next, recording operation will be explained. Recording is performed by changing the magnetization direction of the recording layer of the magnetoresistive film by a synthetic magnetic field by turning on the field effect transistor Tc, selection transistor Tr, and selection transistor T1 on the write line so as to select the magnetoresistive film R1 that records information, and flowing a current into the bit line and write line. In this manner, it is unnecessary to provide new wiring by using the bit line for the magnetization reversal of a specific element, which is preferable. Moreover, a magnetic field applied by the bit line may be applied in the inplane direction of the magnetic film as an assist magnetic field. Since it is possible to reverse the magnetization direction when a current direction is reversed, it is possible to arbitrarily record signals corresponding to "0" and "1".

Figure 9:
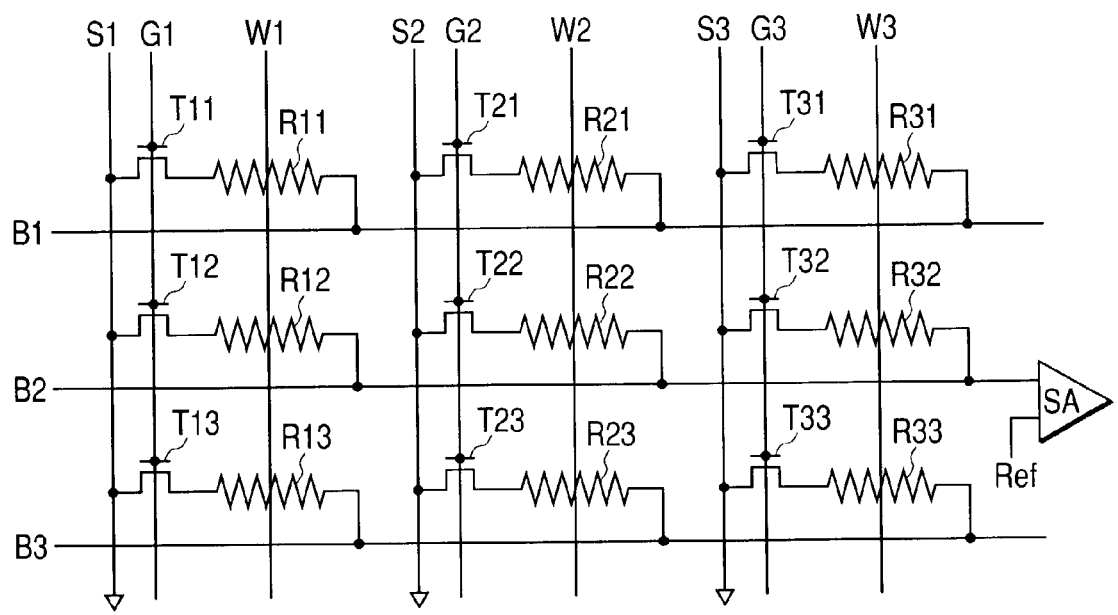
FIG. 9 is an equivalent circuit diagram of memory where memory elements are arranged in a matrix.

Next, a recording and reproducing method of the present invention will be explained as an example of a memory array circuit where memory cells shown in FIG. 9 are arranged in a matrix. The perpendicular magnetic film is made to be used as a magnetic film. When paying attention to a memory cell that is at the center and is constituted by a field effect transistor (T22) and a magnetoresistive film (R22), a bit line B2 is connected to one terminal of the magnetoresistive element (R22) at the center of the cell, and is connected to one terminal of a sense amplifier (SA). Another terminal of the magnetoresistive element (R22) is coupled to a drain terminal of the field effect transistor (T22), and a source terminal of the field effect transistor (T22) is grounded. A word line (A gate line: G2) is connected to a gate terminal of the field effect transistor (T22). Moreover, a write line (W2) is arranged in the vicinity of the magnetoresistive element R22 so as to be orthogonal to the bit line.

Reading operation will be explained in the beginning. First of all, a power supply voltage Vdd is applied to a left-hand edge of the bit line B2, and a voltage is applied to the word line G2 to turn on the transistor T22. Then, a steady-state current flows into the magnetoresistive element R22, and a potential corresponding to the resistance of the magnetoresistive element R22 is generated at the terminal of the sense amplifier (SA) in a right-hand edge of the bit line B2. A potential that is an intermediate value of two potentials caused by two resistances of the magnetoresistive element R22 is applied to another terminal of the sense amplifier SA. Owing to this, either of Vdd or 0V is selected as an output of the sense amplifier according to which of ref or R22 is high resistance.

Next, writing operation will be explained. When information is written in the magnetoresistive element R22, magnetic fields in the place where wiring intersects strengthen each other by flowing a current into the bit line B2 and write line W2 to rewrite the magnetization of R22. When current directions of B2 and W2 are reversed, it becomes possible to apply a magnetic field in the opposite direction. Information is written by such operation.

The write line is arranged so that a magnetic field may be applied vertically to the magnetoresistive film. An insulating film is provided between the write line and magnetoresistive film. A purpose of providing the insulating film is to prevent the write line and magnetoresistive film from short-circuiting. This is necessary for preventing a signal from being deteriorated by a current of the write line mixing with a regenerative signal at the time of reproduction. Moreover, depending on the combination of wiring, it is also possible to perform setting so as to apply a magnetic field in the direction vertical to a film surface of the magnetoresistive film by the bit line.

If a gap between the write line and magnetoresistive film is wide, it is not possible to apply an enough magnetic field, or if it is short, electric breakdown is caused between the write line and magnetoresistive film, or a leakage current flows. Hence, it is preferable that the gap is within 1 nm and 500 nm, and it is desirable that the gap is within 5 nm and 100 nm.

Here, the recording method will be explained further in detail. Recording is performed by properly orienting the magnetization of the magnetic layer of the magnetoresistive film according to information by using a magnetic field generated therefrom by flowing a current into the write line. A current flows into the write line in the direction vertical to this paper face. For example, when a current is flowed toward this paper face, a magnetic field is generated clockwise to the write line. In the structure shown in FIG. 7, when a current is flowed toward this paper face into the write line 10 and a current is flowed into the write line 11 in the direction jumping out from this paper face, a downward perpendicular field is applied to the magnetoresistive element 9b. A current is flowed in the bit line 6 simultaneously with this write line. A magnetic field is applied to the magnetoresistive film in the inplane direction by the bit line current. Though a magnetic field from each of the write line and bit line is applied to a plurality of memory cells, a synthetic magnetic field from these write line and bit line is applied only to the magnetoresistive film located in a dense point of a conductor line where the current is flowed, as a magnetic field that causes magnetization reversal. Owing to this, it is possible to record information only in the predetermined memory cell. It is needless to say to be able to adjust information written according to the direction of the current.

Next, the reproducing method will be explained in detail. As already described, though the reproducing method is roughly classified into the absolute detection method and differential detection method, first of all, the absolute detection method will be described. In the structure of the magnetoresistive film in the absolute detection, one magnetic layer is made a memory layer where magnetic information is stored, and another magnetic layer is made a pinning layer where magnetization is always oriented in the certain predetermined direction. For example, data of "0" and "1" is made to correspond to the upward magnetization and downward magnetization of the memory layer. At the time of recording, the magnetization of the memory layer is oriented according to information by a magnetic field where a current flowed in the write line generates. At the time of reproduction, the detection of information is performed with an absolute value of resistance without performing the magnetization reversal of the magnetic layer. Therefore, since it is unnecessary to perform the magnetization reversal for the detection of a change in resistance at the time of reproduction, it is possible to perform reproduction at high speed and in low power consumption.

Next, the differential detection method will be explained. A magnetoresistive film in differential detection is constituted by a detection layer that has small coercive force and can easily reverse magnetization, and a memory layer that has coercive force larger than that of the detection layer and stores magnetic information. At the time of recording, the magnetization of the memory layer is oriented according to information by a magnetic field where a current flowed in the write line generates. At the time of reproduction, a magnetic field generated by the write line is applied while being made weaker than that at the time of recording to reverse the magnetization direction of only the detection layer. Owing to this operation, it becomes possible to detect the recorded information by a change of resistance from small resistance to large resistance or vice versa along with the application of a weak magnetic field. Though this method cannot read information at the speed higher than that of the absolute detection, it is possible to reproduce information in good sensibility by using a differential detection method etc. even if a signal is small.

EXAMPLES

Example 1

Hard masks with different angles of gradient of a sidewall were produced by using FIB (Focused Ion Beam processing apparatus) so as to confirm effects of the present invention. Then, tunnel magnetoresistive (TMR) elements were produced by using these hard masks to examine the quantity of the offset magnetic field in an MR curve.

The producing procedure of the elements was as shown in FIGS. 10 to 14. In FIGS. 10 to 14, locations that changed from a former step and should be paid attention to are shown as slashed portions at any time. First of all, a TMR-structured film and hard mask material were film-formed on a Si wafer. A magnetron sputtering apparatus was used for the film formation. Moreover, in regard to the tunnel film, plasma oxidation was given after forming the sputtering film. Film structure is shown in Table 1.

TABLE 1

| Material | Film thickness (nm) |
| --- | --- |
| Al (Upper electrode) | 50 |
| W (Hard mask) | 60 |
| Pt | 2 |
| $Tb_{20}Fe$ | 30 |
| $Al_2O_3$ | 1.5 |
| $Gd_{22}Fe$ | 50 |
| $Al_{80}Cu$ | 25 |
| $SiO_2$ | 1000 |
| Si wafer | |

Figure 10:
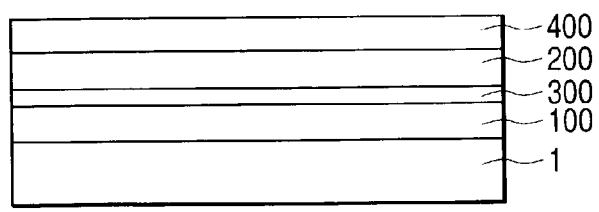
FIG. 10 is a diagram for explaining a process step of producing the memory element of the first example.
Figure 11:
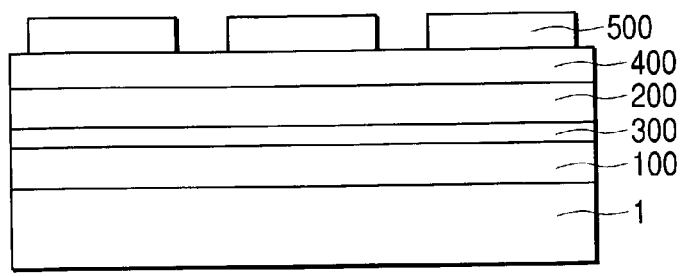
FIG. 11 is a diagram for explaining another process step of producing the memory element of the first example.
Figure 12:
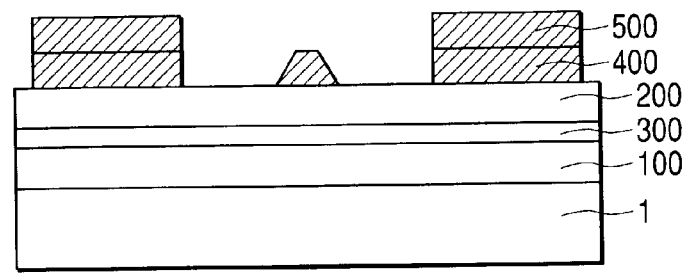
FIG. 12 is a diagram for explaining still another process step of producing the memory element of the first example.
Figure 13:
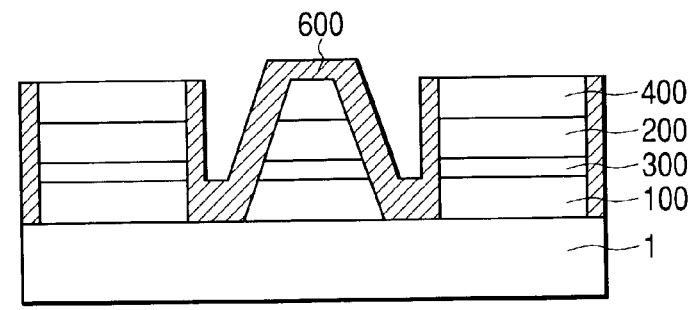
FIG. 13 is a diagram for explaining further process step of producing the memory element of the first example.
Figure 14:
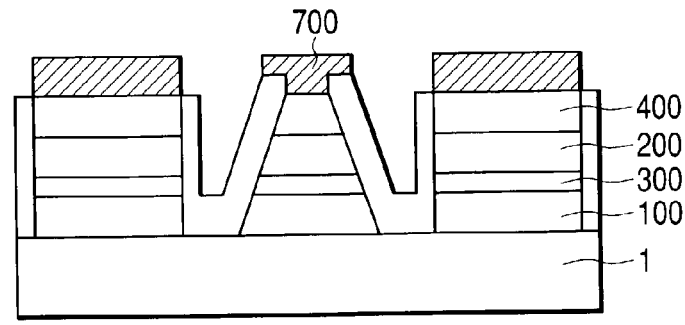
FIG. 14 is a diagram for explaining another process step of producing the memory element of the first example.

FIG. 10 schematically shows a state that the film formation of a filled-in film ends, and other members except a substrate 1, a first magnetic layer 100, a non-magnetic layer 300, a second magnetic layer 200, and a hard mask 400 are omitted. Next, a resist pattern was formed on the filled-in film by using photolithography (FIG. 11). In FIG. 11, a central portion of the resist mask 500 is a place for forming a tunnel junction, and both sides are for electrode pads. Next, wafers with resist were loaded into an FIB apparatus to process the resist masks and hard mask material. When the tunnel junction that corresponds to a memory cell was processed, each sample was loaded while being inclined to a beam to be made in a shape having a desired wall angle (FIG. 12). Next, the samples were loaded into an ion milling apparatus to be given element processing. After the processing, the samples were loaded into the magnetron sputtering apparatus again with the attaching the resist mask, and an insulating film 600 was formed. The insulating film and resist mask were lifted off at the same time. FIG. 13 shows a state that the liftoff was completed after insulating film 600 was formed. A resist mask for an upper electrode pattern was newly formed after making a hole in an insulating film of each tunnel junction portion with FIB, and each magnetoresistive element was completed by the liftoff after the film formation of an upper electrode 700 (FIG. 14).

A reason why elements with different wall angles were produced by using FIB is that it is easy to produce the elements where only angles were different in a state that other conditions were the same. Moreover, the hard mask 400 also played the role of preventing an injection damage of the magnetic layer by a Ga ion beam used in FIB.

The completed elements were evaluated by an MR measuring device by applying a magnetic field in the direction vertical to a film surface after magnetization. The size of each produced element was 1 $\mu$m square, and wall angles of produced junctions were within 30° and 90° in increments of 15° in the hard masks. In consideration of the dispersion between wafers, a plurality of elements with the same angle was produced on the same wafer. An AFM was used for the measurement of the wall angle.

All the produced elements showed the MR curve with the squareness of 1, MR was about 25%, and standardized resistance was 0.5 M$\Omega\mu$m$^2$.

Figure 15:
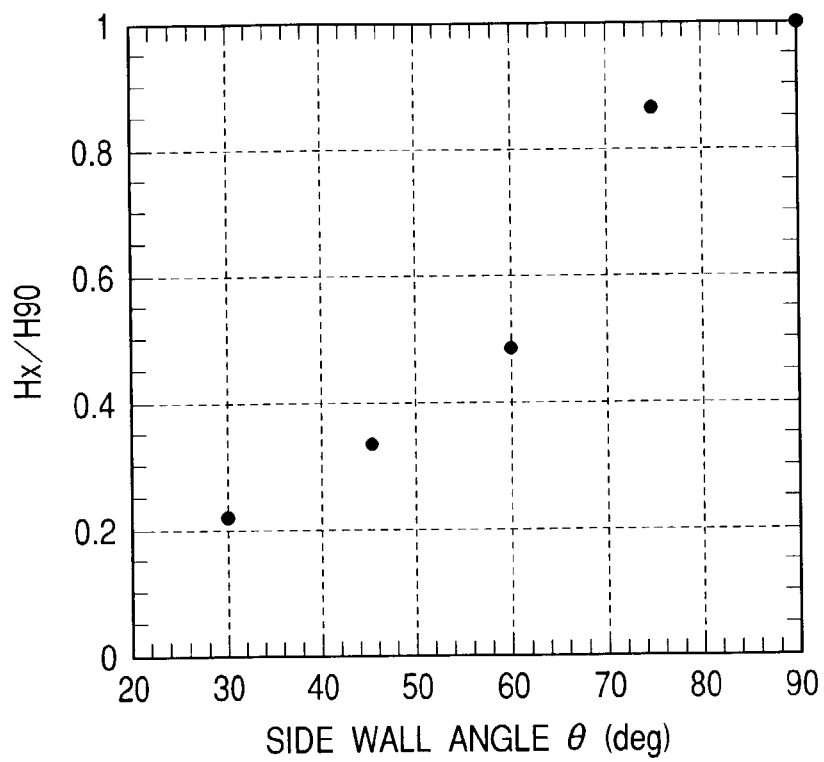
FIG. 15 is a graph showing the relation between the angle of gradient and the size of an offset magnetic field.
Figure 25:
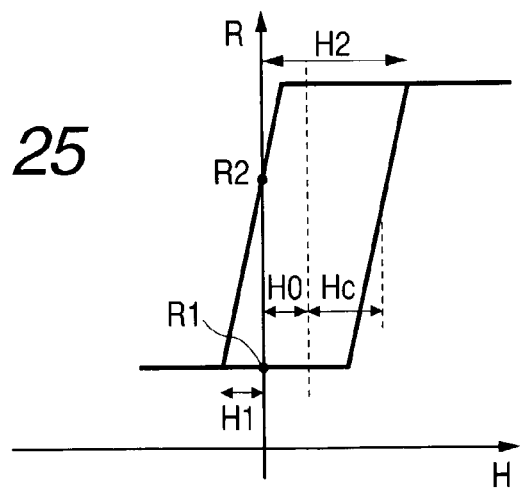
FIG. 25 is a R-H curve for explaining an offset magnetic field HO in an MR curve at the time of squareness<1.

FIG. 15 shows measurements showing the relation between the wall angle of the magnetoresistive element and the offset magnetic field of the MR curve. An offset magnetic field corresponds to HO in FIG. 25B. The vertical axis Hx/H90 is dimensionless quantity that is normalized by the amplitude of the offset magnetic field at the time of 90° of sidewall. FIG. 15 shows that the smaller the wall angle is, the smaller the offset magnetic field is. It is understandable that, from when the tapered angle exceeds about 70° in particular, the offset magnetic field decreases largely. That is, in the magnetoresistive element, it is clarified to be able to decrease the influence of a static magnetic field from one magnetic layer.

Example 2

Figure 16:
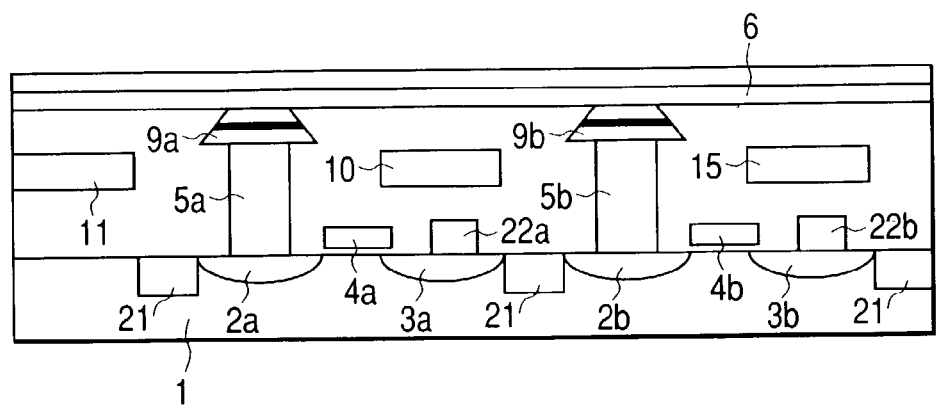
FIG. 16 is a sectional view showing a memory device that uses magnetoresistive elements according to the first example.

FIG. 16 shows the cross-sectional structure of this example. A memory cell shares a write line with an adjoining memory cell. In addition, a portion to which a symbol is not assigned fundamentally denotes an insulator. Two memory elements are shown in the figure, and portions whose functions are the same, and which are peculiar to each are separately shown as a and b. On a semiconductor substrate 1, a drain region 2 and a source region 3 are formed, and further, a gate electrode 4 is formed through an insulating film, these constituting a MOSFET (field effect transistor). Each field effect transistor is insulated with a LOCOS field oxide film 21.

A magnetoresistive element 9 that is magnetized in the direction vertical to a film surface at a position on the drain region 2 is connected to the drain region 2 of the field-effect transistor through a plug electrode 5, and further, is connected to a bit line 6. A grounding wire not shown is provided in a source electrode 22. Moreover, write lines 10 and 11 (10, 15) are provided through the insulator under both sides of magnetoresistive element 9a(9b). The write lines 10, 11, and 15, gate line 4, and grounding wire connected to the source electrode extend in the direction vertical to this paper face. The bit line 6 extends in the direction parallel to this paper face.

The example shown in FIG. 16 has the structure that the write line 10 can be used for both of the left-hand magnetoresistive element 9a and right-hand magnetoresistive element 9b. Hence, when information is recorded in the magnetoresistive element 9a, the write lines 10 and 11 are used, and when information is recorded in the magnetoresistive element 9b, the write lines 10 and 15 are used. Since a number of write lines decreases in comparison with a case of providing two write lines independently respectively, a degree of integration can be improved.

Figure 17:
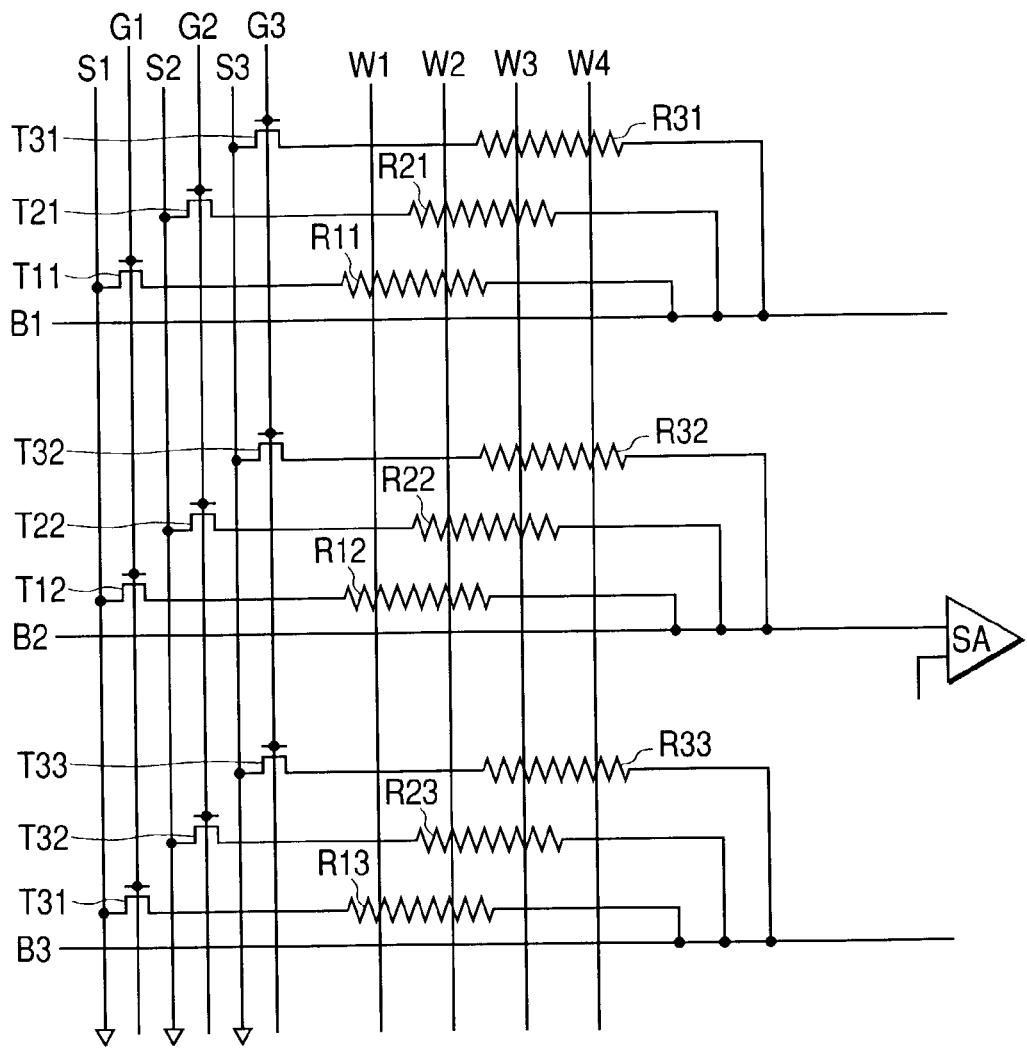
FIG. 17 is an equivalent circuit diagram of memory where memory elements according to the first example are arranged in a matrix.

FIG. 17 shows a memory array circuit where the memory cells in FIG. 16 are arranged in a matrix. When paying attention to a memory cell that is at the center and is constituted by a field effect transistor (T22) and a magnetoresistive film (R22), a bit line B2 is connected to one terminal of the magnetoresistive element (R22) at the center of the cell, and is connected to one terminal of a sense amplifier (SA). Another terminal of the magnetoresistive element (R22) is coupled to a drain terminal of the field effect transistor (T22), and a source terminal of the field effect transistor (T22) is grounded. A word line (G2) is connected to a gate terminal of the field effect transistor (T22). Moreover, write lines (W2 and W3) are arranged in the vicinity of the magnetoresistive element R22 so as to be orthogonal to the bit line.

Two write lines W2 and W3 act as magnetoresistive elements R21, R22, and R23. Among these, the write line W2 acts on the magnetoresistive elements R11, R12, and R13 with the write line W1. The write line W3 acts on the magnetoresistive elements R31, R32, and R33 with the write line W4.

Reading operation will be explained in the beginning. First of all, a power supply voltage Vdd is applied to a left-hand edge of the bit line B2, and a voltage is applied to the word line G2 to turn on the transistor T22. Then, a steady-state current flows into the magnetoresistive element R22, and a potential corresponding to the resistance of the magnetoresistive element R22 is generated at the terminal of the sense amplifier (SA) in a right-hand edge of the bit line B2. A potential that is an intermediate value of two potentials caused by two resistances of the magnetoresistive element R22 is applied to another terminal of the sense amplifier SA. Owing to this, either of Vdd or 0V is selected as an output of the sense amplifier according to which of ref or R22 is high resistance.

Next, writing operation will be explained. When information is written in the magnetoresistive element R22, magnetic fields in the place where wiring intersects strengthen each other by flowing a current into the bit line B2 and write lines W2 and W3 to rewrite the magnetization of R22. When current directions of B2, and W2 and W3 are reversed, it becomes possible to apply a magnetic field in the opposite direction. Information is written by such operation.

Figure 18:
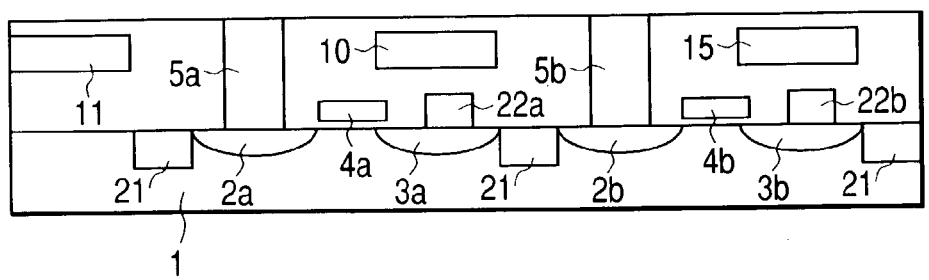
FIG. 18 is a diagram for explaining a process step of producing a memory of a second example.
Figure 19:
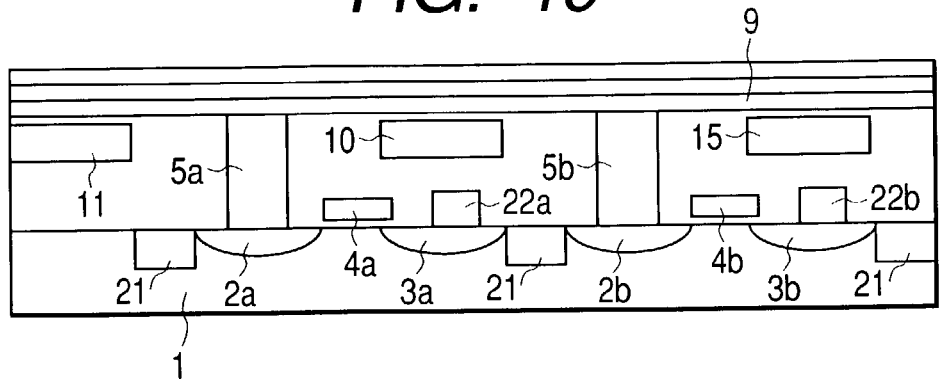
FIG. 19 is a diagram for explaining another process step of producing a memory of the second example.
Figure 20:
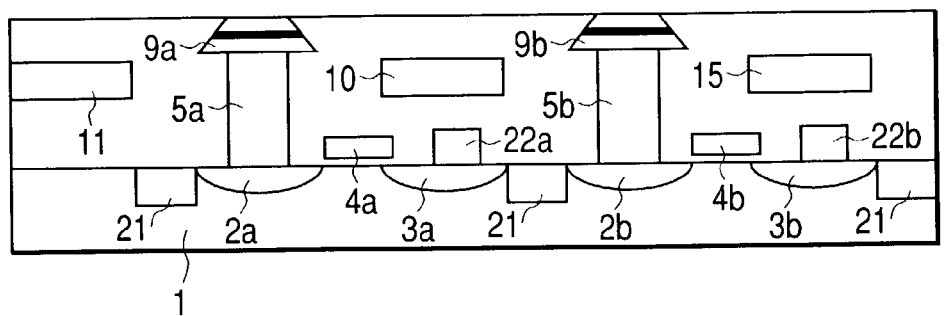
FIG. 20 is a diagram for explaining still another process step of producing a memory of the second example.

FIGS. 18 to 20 are process flowcharts for producing the memory of this example shown in FIG. 16.

First of all, MOSFET shown in FIG. 18 was produced by using well-known semiconductor process. On a semiconductor substrate 1, a drain region 2 and a source region 3 were formed, and further, a gate electrode 4 was formed through an insulating film, these constituting a MOSFET (field effect transistor). Each field effect transistor was insulated with a LOCOS field oxide film 21.

A plug electrode 5 was formed in the drain region 2 of the field-effect transistor, and write lines 10, 11, and 15 were provided in both sides of the plug electrode 5a(5b) through an insulator.

Next, a magnetoresistive film 9 was film-formed by using a magnetron sputter (FIG. 19). On the way, an Al2O3 layer that was a non-magnetic layer was refined by performing plasma oxidation.

Moreover, the processing that regulates a region that became a memory cell connected to the plug electrode was performed, and its periphery was electrically isolated with an insulating layer (FIG. 20). When processing the magnetoresistive elements, a shape of resist used was adjusted so that a taper with a low gradient could be formed in process. The sidewall gradient was about 45(. Ion milling was used for the processing as usual.

When the bit line 6 was formed in the direction parallel to this paper face so as to connect to the magnetoresistive elements 9a and 9b and was buried with an insulating layer (FIG. 16), the process completed.

Owing to the structure of this example, it was possible to achieve a high degree of integration while greatly lowering the current density of the write line. Moreover, since the cross-sectional structure of the magnetoresistive elements was trapezoidal, an offset of a reversed magnetic field was not generated, and power consumption could be controlled. Moreover, it was clarified that, since the offset of the reversed magnetic field could be controlled without almost modifying the conventional process, this was a very low-cost method.

Example 3

Figure 21:
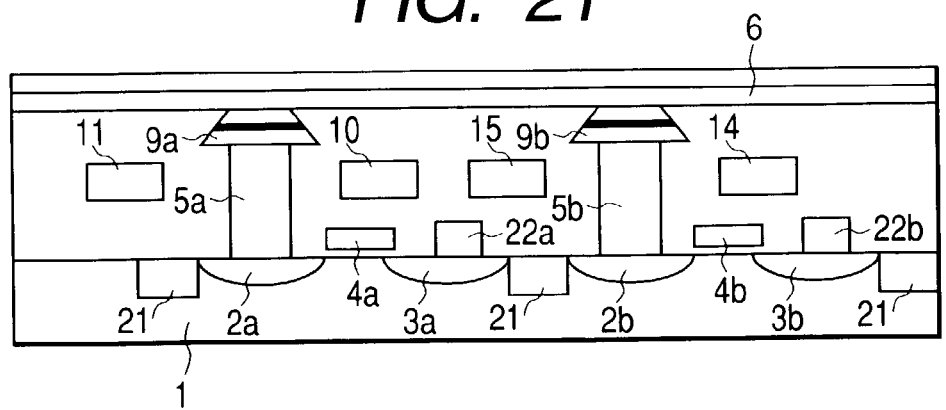
FIG. 21 is a schematic sectional view of memory according to a third example.

FIG. 21 shows the cross-sectional structure of this example according to the present invention. While being compared with FIG. 7, two write lines per memory cell are arranged. Owing to the above-described structure, since it is possible to perform recording by flowing a current into the write line for the memory cells 9a and 9b at the same time, it becomes possible to accelerate speed. Moreover, since the cross-section of the magnetoresistive elements according to the present invention was trapezoidal, an offset of a reversed magnetic field was not generated, and power consumption could be controlled.

Example 4

Figure 22:
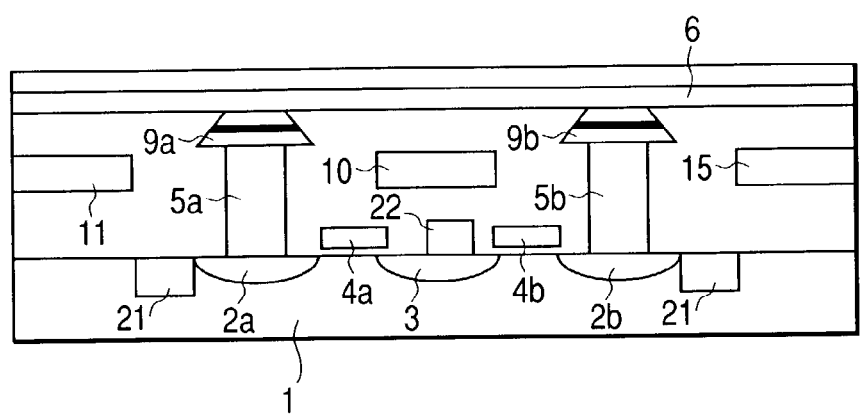
FIG. 22 is a schematic sectional view of memory according to a fourth example.
Figure 23A:
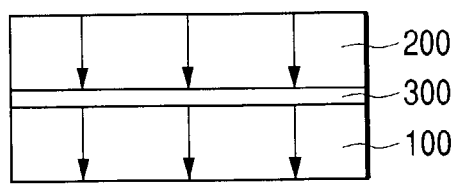
FIGS. 23A and 23B are schematic diagrams for explaining magnetized states of a magnetoresistive element.
Figure 23B:
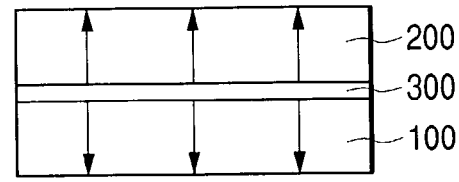
Figure 24A:
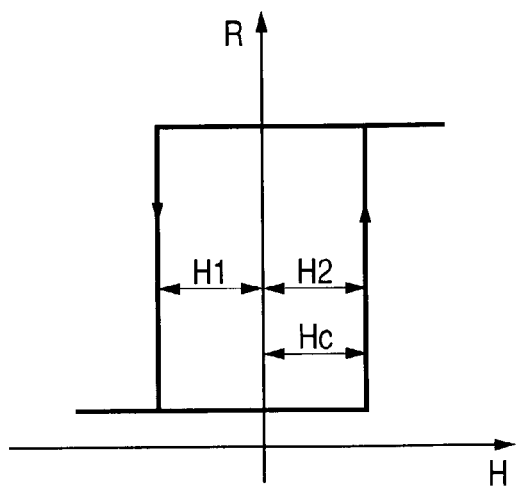
FIGS. 24A, 24B, and 24C are R-H curves for explaining an offset magnetic field HO in an MR curve at the time of squareness=1.
Figure 24B:
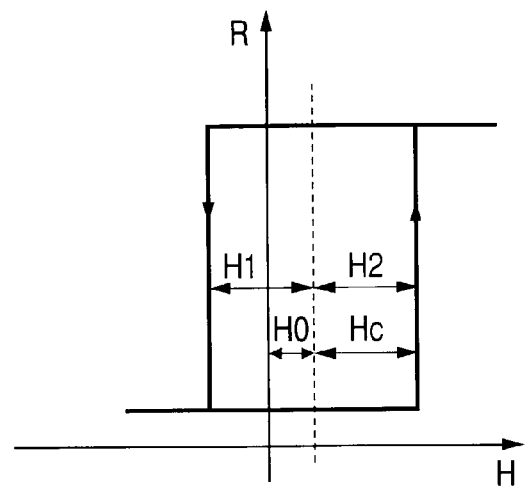
Figure 24C:
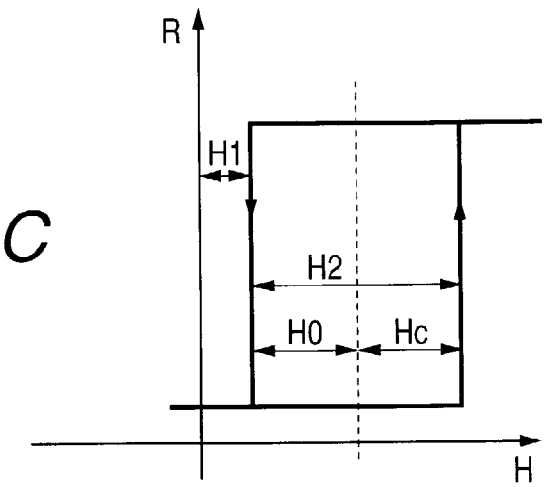

FIG. 22 shows the cross-sectional structure of this example according to the present invention. A memory cell shares a write line with an adjoining memory cell. In addition, this has the structure that a source region 3 is shared by the magnetoresistive films 9a and 9b. Owing to the structure of this example, since device structure is simplified by a number of wirings decreasing by sharing a source region, a memory element can be miniaturized. Moreover, since the cross-section of the magnetoresistive elements according to the present invention was trapezoidal, that is, tapered structure, an offset of a reversed magnetic field was not generated, and power consumption could be controlled.

What is claimed is:

1. A magnetoresistive element comprising a first magnetic layer and a second magnetic layer whose coercive forces are different, and a non-magnetic layer disposed between the magnetic layers, wherein edges of the magnetoresistive element have tapered angle, and wherein the non-magnetic layer is an insulator.

2. The magnetoresistive element according to claim 1, wherein an easy magnetization axis of the first magnetic layer and the second magnetic layer is in a direction vertical to a film surface.

3. The magnetoresistive element according to claim 2, wherein the first magnetic layer or the second magnetic layer is made of a rare-earth transition metal alloy.

4. The magnetoresistive element according to claim 1, wherein a magnetic layer containing at least one element of Fe and Co is provided between at least either the first magnetic layer and to non-magnetic layer, or the second magnetic layer and the non-magnetic layer.

5. The magnetoresistive element according to claim 1, wherein the tapered angle is in the range of 30° to 70°.

6. A magnetoresistive element comprising a first magnetic layer and a second magnetic layer, and a non-magnetic layer disposed between the magnetic layers, wherein coercive force of the first magnetic layer is larger than coercive force of the second magnetic layer, and wherein the relation between a base area S1 of the first magnetic layer and a base area S2 of the second magnetic layer is S1>S2, and the non-magnetic layer is an insulator.

7. The magnetoresistive element according to claim 6, wherein an easy magnetization axis of the first magnetic layer and the second magnetic layer is in a direction vertical to a film surface.

8. The magnetoresistive element according to claim 7, wherein the first magnetic layer or the second magnetic layer is made of a rare-earth transition metal alloy.

9. The magnetoresistive element according to claim 6, wherein a magnetic layer containing at least one element of Fe and Co is provided between at least either the first magnetic layer and the non-magnetic layer, or the second magnetic layer and the non-magnetic layer.

* * * * *